(12) United States Patent
Sakakibara

(10) Patent No.: US 8,575,969 B2
(45) Date of Patent: Nov. 5, 2013

(54) SEMICONDUCTOR DEVICE HAVING DIFFERENTIAL PAIR TRANSISTORS WITH A SWITCHABLE TAIL CURRENT

(75) Inventor: Kiyohiko Sakakibara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/482,891

(22) Filed: May 29, 2012

(65) Prior Publication Data
US 2012/0306546 A1    Dec. 6, 2012

(30) Foreign Application Priority Data

May 31, 2011    (JP) ................................. 2011-122140

(51) Int. Cl.
*H03K 5/22*    (2006.01)

(52) U.S. Cl.
USPC ..................... 327/89; 327/53; 327/65; 327/66

(58) Field of Classification Search
USPC ............ 327/65, 66, 78, 79, 83, 88, 89, 52, 53
See application file for complete search history.

(56) References Cited

U.S. PATENT DOCUMENTS

| | | | | |
|---|---|---|---|---|
| 5,334,891 A | * | 8/1994 | Marbot | 327/281 |
| 5,475,323 A | * | 12/1995 | Harris et al. | 327/67 |
| 5,734,272 A | * | 3/1998 | Belot et al. | 326/126 |
| 6,051,999 A | * | 4/2000 | To et al. | 327/66 |
| 6,617,888 B2 | * | 9/2003 | Volk | 327/67 |
| 7,102,392 B2 | * | 9/2006 | Hsu et al. | 327/20 |
| 7,187,206 B2 | * | 3/2007 | Clements et al. | 326/82 |
| 8,149,048 B1 | * | 4/2012 | Mar | 327/563 |
| 2007/0008017 A1 | * | 1/2007 | Pan | 327/65 |
| 2009/0033371 A1 | * | 2/2009 | Braswell et al. | 327/65 |

FOREIGN PATENT DOCUMENTS

| | | |
|---|---|---|
| JP | 2005-035515 | 2/2005 |
| JP | 2006222329 | * 8/2006 |

OTHER PUBLICATIONS

"Design of Analog CMOS Integrated Circuits," Chapter 4, Razavi I. Behzad, McGraw-Hill Higher Education, Oct. 2003.
Jeroen A. Croon et al., "An Easy-to-Use Mismatch Model for the MOS Transistor," IEEE Journal of Solid-State Circuits, vol. 37, pp. 1056-1064, 2002.
Marcel J.M. Pelgrom et al., "Matching Properties of MOS Transistors," IEEE Journal of Solid-State Circuits, vol. 24, pp. 1433-1440, 1989.

(Continued)

*Primary Examiner* — Lincoln Donovan
*Assistant Examiner* — Jung H. Kim
(74) *Attorney, Agent, or Firm* — McDermott Will & Emery LLP

(57) ABSTRACT

A semiconductor device configured that its differential pair is made operable in both states of high speed with a high consumption current and low speed with a low consumption current. A differential circuit includes differential pair transistors and a tail current source for supplying a tail current that is switchable so that an amount of current flowing in the differential pair transistors may be switched between at least two sates of different levels. The differential pair transistors have a characteristic that, with a decrease of currents flowing in the differential pair transistors, a value of $\sigma(\Delta I/gm)$ decreases monotonously, where $\sigma$ denotes a standard deviation, $\Delta I$ denotes a difference of the amounts of current of the differential pair transistors, and gm denotes transconductance of the differential pair transistors.

17 Claims, 9 Drawing Sheets

(56) References Cited

OTHER PUBLICATIONS

Naoyuki Shigyo et al., "Analysis of an Anomalous Subthreshold Current in a Fully Recessed Oxide MOSFET Using a Three-Dimensional Device Simulator," IEEE Trans. Electron Devices, vol. ED-32, pp. 441-445, 1985.

A. Mizumura et al., "A Study of 90nm MOSFET Subthreshold Hump Characteristics Using Newly Developed MOSFET Array Test Structure," Proc. IEEE 2005 Int. Conference on Microelectronics Test Structures, 99. 3942, vol. 18, Apr. 2005.

David Binkley, "Tradeoffs and Optimization in Analog CMOS Design," Aug. 2008.

* cited by examiner

GATE VOLTAGE MAKES
POTENTIAL VARY.

GATE VOLTAGE MAKES
POTENTIAL VARY.

SEMICONDUCTOR DEVICE HAVING DIFFERENTIAL PAIR TRANSISTORS WITH A SWITCHABLE TAIL CURRENT

CROSS-REFERENCE TO RELATED APPLICATIONS

The disclosure of Japanese Patent Application No. 2011-122140 filed on May 31, 2011 including the specification, drawings and abstract is incorporated herein by reference in its entirety.

BACKGROUND

The present invention relates to a semiconductor device.

There are many cases where highness or lowness of certain constant input voltage is compared with an other voltage in an analog circuit. It is common to use a differential pair in performing this comparison determination (i.e., see RAZAVI Behzad, "Design of Analog CMOS Integrated Circuits," Chapter 4, October 2003).

When a voltage is put into a comparison in the differential pair, mismatch of the MOS transistors that constitute the differential pair causes an input offset voltage.

A characteristic of this input offset voltage depends on whether an operation region of the MOS transistors constituting the differential pair is the strong inversion region or the weak inversion region. The strong inversion region is a region where the MOS transistor is made to operate at high speed with a high consumption current, while the weak inversion region is a region where the MOS transistor is made to operate at low speed with a low consumption current.

SUMMARY

Digressing for a moment, there is a demand of wishing to use the analog circuit by changing an operation at high speed with a high consumption current and an operation at low speed with a low consumption current. In order to meet this demand, conventionally, the circuit supported it either by installing both a differential pair for operating at high speed with a high consumption current and a differential pair for operating at a low speed with a low consumption current in a single microcomputer or by installing therein a large transistor capable of operating in both regions, a weak inversion region and a strong inversion region. As a result, the circuit required a large layout area for the differential pair.

Therefore, an object of the present invention is to provide a semiconductor device that is configured to be able to make its differential pairs operate in both states, at high speed with a high consumption current and at low speed with a low consumption current, without enlarging the layout area.

According to one aspect of the present invention, a semiconductor device includes differential pair transistors and a tail current source for supplying tail currents switchable so that amounts of current flowing in the differential pair transistors may be changed between at least two levels, and the differential pair transistors each have a characteristic that, with a decrease of the currents flowing in the differential pair transistors, a value of $\sigma(\Delta I/gm)$ decreases monotonously, where $\sigma$ denotes a standard deviation, $\Delta I$ denotes a difference of the amounts of current of the differential pair transistors, and gm denotes transconductance of the differential pair transistors.

According to the aspect of the present invention, it is possible to make the semiconductor device operate in both states of one at high speed with a high consumption current and one at low speed with a low consumption current, without enlarging the layout area.

BRIEF DESCRIPTION OF THE DRAWINGS

FIG. 2A and FIG. 2B are diagrams each showing a change of a current with respect to a gate voltage, in which FIG. 2A shows the case of a transistor whose channel edge has a lower barrier than the channel central part where a current Ie flows in the channel edge and a current Ic flows in the channel central part, FIG. 2B shows a composition of Ie and Ic.

FIG. 3A and FIG. 3B are diagrams each showing a change of $\sigma(\Delta I/gm)$ for a transistor having a hump characteristic, in which FIG. 3A is the change when the temperature is 25° C., and FIG. 3B is the change when the temperature is −40° C.;

FIG. 4A and FIG. 4B are diagrams each showing a change of $\sigma(\Delta I/gm)$ for a transistor having no hump characteristic, in which FIG. 4A is the change when the temperature is 25° C., and FIG. 4B is the change when the temperature is −40° C.;

FIGS. 9A, 9B, 9C, and 9D are diagrams for explaining a layout structure of NMOS transistors NR1 and NR2, in which FIG. 9A is a plan view of the NMOS transistors NR1 and NR2, FIG. 9B is a diagram showing the case where the gate is removed in FIG. 9A, FIG. 9C is a a-b sectional view in FIG. 9A, and FIG. 9D is a c-d sectional view in FIG. 9A;

FIG. 11A and FIG. 11B are diagrams each showing a potential in a path, in which FIG. 11A is for a path that is shown by line A-A' in a layout plan view of FIG. 10 and extends from a source S to a drain D, and FIG. 11B is for a path that is shown by line B-B' in the layout plan view of FIG. 10 and extends from the source to the drain.

DETAILED DESCRIPTION

Figure 1:
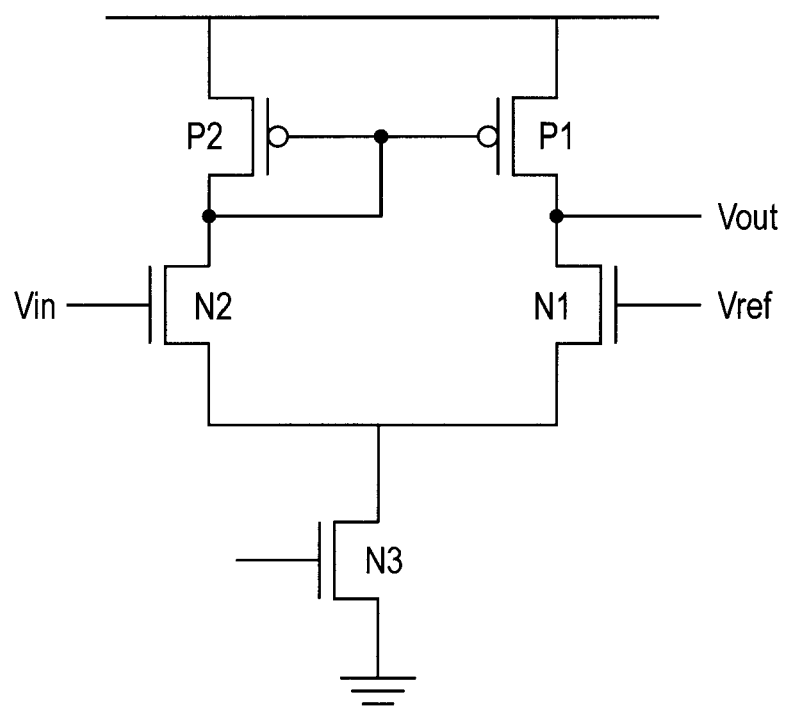
FIG. 1 is a diagram showing an example of differential pair transistors.

First, a mismatch characteristic of transistors that constitute a differential pair as shown in FIG. 1 will be explained.

First, literatures quoted below will be shown.

[1] Paper about $\sigma(\Delta I/gm)$ of a differential pair input offset, "An Easy-to-Use Mismatch Model for the MOS Transistor," IEEE Journal of Solid-State Circuits, Vol. 37, pp. 1056-1064, 2002

[2] Paper about a mismatch being proportional to $1/\sqrt{(LW)}$, "Matching Properties of MOS Transistors," IEEE Journal of Solid-State Circuits, Vol. 24, pp. 1433-1440, 1989

[3] Paper about a hump characteristic in a weak inversion region, "Analysis of an Anomalous Subthreshold Current in a Fully Recessed Oxide MOSFET Using a Three-Dimensional Device Simulator," IEEE Trans. Electron Devices, Vol. ED-32, pp. 441-445, 1985

[4] Paper about the hump characteristic in the weak inversion region, "A Study of 90 mm MOSFET Subthreshold Hump Characteristic Using Newly Developed MOSFET Array Test Structure," Proc. IEEE 2005 Int'l Conference on Microelectronic Test Structures, Vol. 18, pp. 39-42, April 2005

[5] Explanation of a definition of the inversion region, David Binkley, "Tradeoffs and Optimization in Analog CMOS Design," August 2008. Due to the mismatch characteristic of the transistors N1, N2 that constitute the differential pair as shown in FIG. 1, the input offset voltage arises between the NMOS transistors constituting the differential pair. A variation in the input offset voltage can be estimated by $\sigma(\Delta I/gm)$ (for example, see the literature [1]).

Here, $\sigma$ denotes a standard deviation, $\Delta I$ denotes a difference of currents flowing in two NMOS transistors constituting the differential pair, and gm denotes transconductance of two NMOS transistors constituting the differential pair.

The literature [1] reports that when a current value is being lowered from the strong inversion region to the weak inversion region, $\sigma(\Delta I/gm)$ increases in the weak inversion region. The authors of the literature [1] only inferred existence of an additional mismatch effect to this increase of $\sigma(\Delta I/gm)$ in the weak inversion region, and did not consider a sufficient reason.

On the other hand, the literature [2] reports that an amount of mismatch is proportional to $1/\sqrt{(LW)}$. Here, L is a gate length of the transistor and W is a channel width of the transistor.

Considering a fact that the change characteristic of $\sigma(\Delta I/gm)$ by a transistor inversion region and the amount of mismatch described in the literature [2] are proportional to $1/\sqrt{(LW)}$, if it is intended to decrease the amount of mismatch to be equal to or less than a certain tolerance in the weak inversion region, generally, there is no choice but to enlarge the channel area of the transistors larger than those of what is designed in the strong inversion region.

The inventors of this application have considered a phenomenon that "with a decrease of a current value flowing in the transistor, $\sigma(\Delta I/gm)$ increases in the weak inversion region" having been reported in the literature [1].

The inventors of this application have paid their attention to a fact that it is reported in the literature [3] etc. that there is a case where the hump characteristic appears in the weak inversion region, i.e., a subthreshold region.

The hump characteristic means that a hump (bump) is formed in a current flowing in the transistor in the weak inversion region.

The literature [3] explains a cause of the hump characteristic. The height of potential barrier is different between a channel central part in a channel width direction and a channel edge in the channel width direction for electric charge excitation from the source to the channel. Let Ic denote the current flowing in the channel central part, and let Ie denote the current flowing in the channel edge.

In the transistor whose channel edge has a lower barrier than that of its channel central part in the channel width direction, with an increase of a gate voltage Vg, electric charges therein are excited earlier than in the channel central part, and the current Ie is observed between the source and the drain. Since the current driving capacity of a channel edge is low, this current Ie increases exponentially with an increase of the gate voltage Vg, and is saturated quickly (see log(Ie) of FIG. 2A).

Figure 2A:
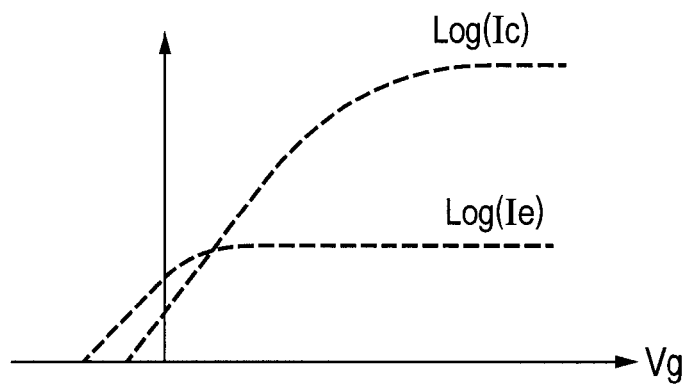

On the other hand, with the increase of the gate voltage Vg, the channel central part begins to contribute to electrical conduction and the current Ic in the channel central part becomes dominant (see the log(Ic) of FIG. 2A).

Figure 2B:
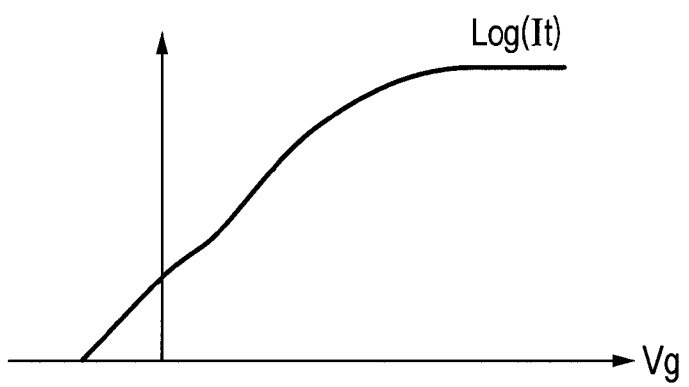

Therefore, the current flowing in the transistor becomes a composition of the current Ic and the current Ie (see log(It) of FIG. 2B).

Figure 2C:
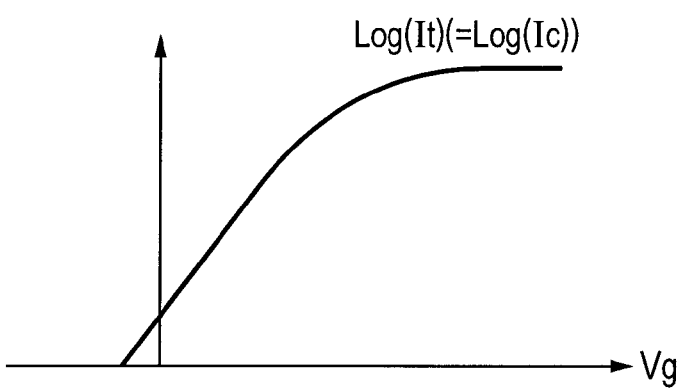
FIG. 2C shows the case of a transistor whose channel edge has a higher barrier than the channel central part where no hump characteristic arises.

Incidentally, in a transistor whose channel edge has a higher barrier than that of its channel central part in the channel width direction, since the current Ie is not observed as described above, no hump characteristic arise in the weak inversion region. That is, a hump (bump) is not formed in the current flowing in the transistor (see FIG. 2C).

Moreover, it is widely known that if a back gate potential is increased or the temperature is lowered, the hump characteristic described above becomes more apparent.

The literature [4] describes an example of a transistor that produces the hump characteristic. This literature describes that the transistor with a divot in an end (edge) of an STI region has the hump characteristic.

The inventors of this application formed intentionally a transistor easy to produce the hump based on the finding of the literature [3], investigated its $\sigma(\Delta I/gm)$ characteristic, and as a result, acquired the following finding.

Figure 3A:
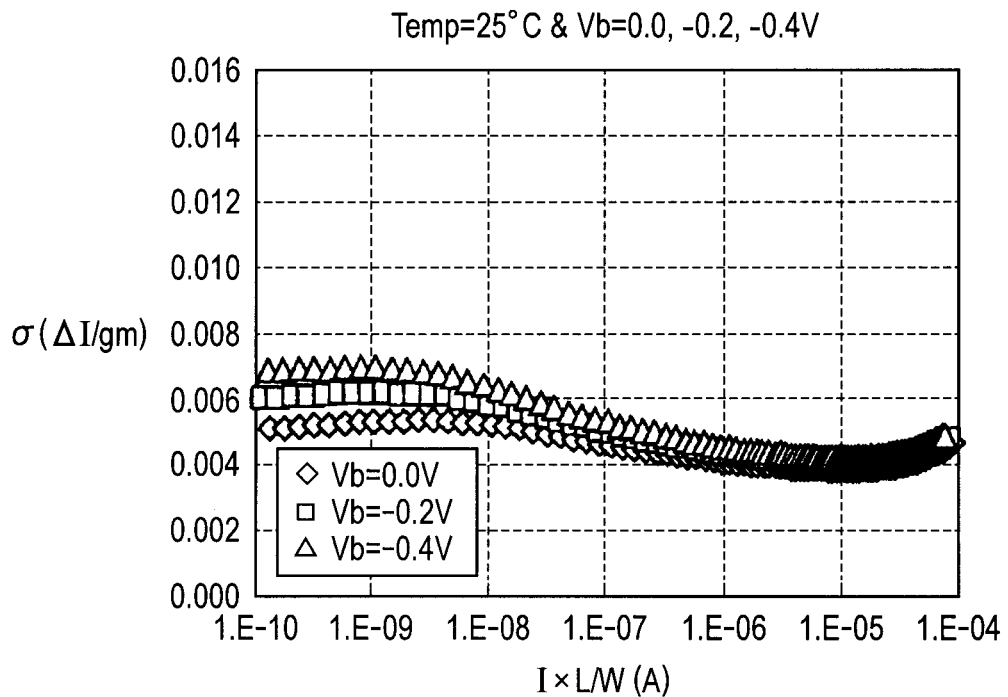

FIG. 3A is a diagram showing a change of $\sigma(\Delta I/gm)$ with respect to I×L/W when the temperature is 25° C. and back gate voltages Vb are 0.0 V, −0.2 V, and −0.4 V for a transistor having a hump characteristic. Here, I is a drain current, L is the gate length, and W is the channel width. Incidentally, FIG. 3A and FIG. 3B show measurement examples with the NMOS transistor and the back gate voltages take negative values.

Figure 3B:
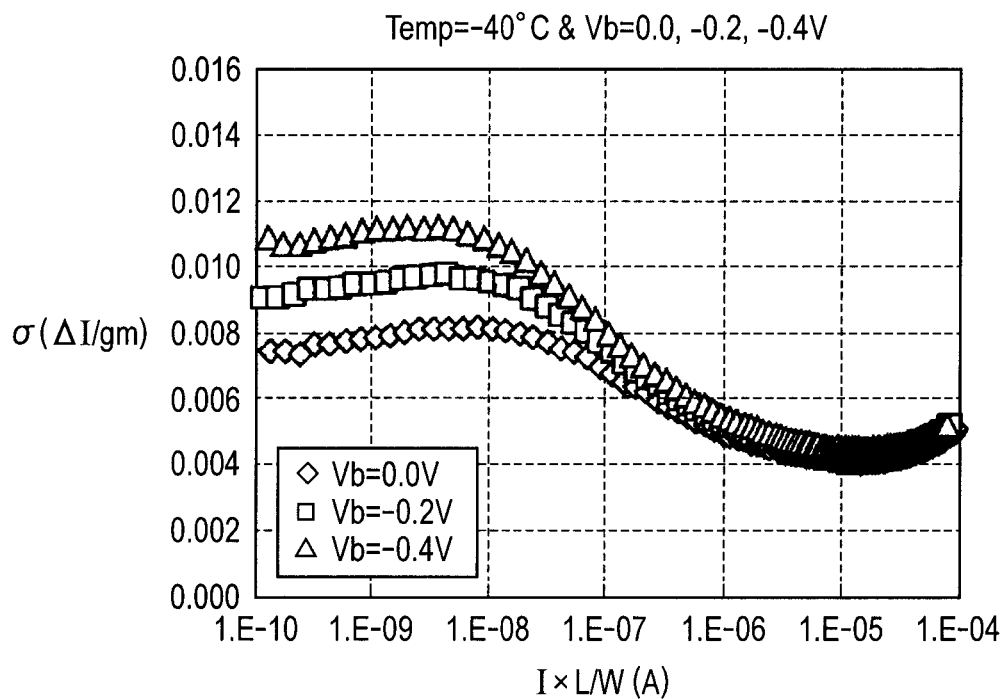

FIG. 3B is a diagram showing a change of $\sigma(\Delta I/gm)$ with respect to I×L/W when the temperature is −40° C. and the back gate voltages Vb are 0.0 V, −0.2 V, and −0.4 V for the transistor having the hump characteristic.

(1) Similarly with what was shown by the literature [1], as shown in FIG. 3A and FIG. 3B, the $\sigma(\Delta I/gm)$ characteristic shows an increase tendency as the current flowing in the transistor is decreased. That is, the $\sigma(\Delta I/gm)$ characteristic increases more when the transistor is made to operate in the weak inversion region than to operate in the strong inversion region.

(2) As shown in FIG. 3A and FIG. 3B, when the back gate voltage is increased, the $\sigma(\Delta I/gm)$ characteristic exhibits a still more remarkable increase tendency in the weak inversion region.

(3) As shown in FIG. 3A and FIG. 3B, when the temperature is decreased, the $\sigma(\Delta I/gm)$ characteristic exhibits a still more remarkable increase tendency in the weak inversion region.

The findings of (2) and (3) agree with a tendency of the generally known hump characteristic. Furthermore, as a result of investigation of the $\sigma(\Delta I/gm)$ characteristic of a transistor manufactured so that it may have no hump characteristic, the following finding was acquired.

Figure 4A:
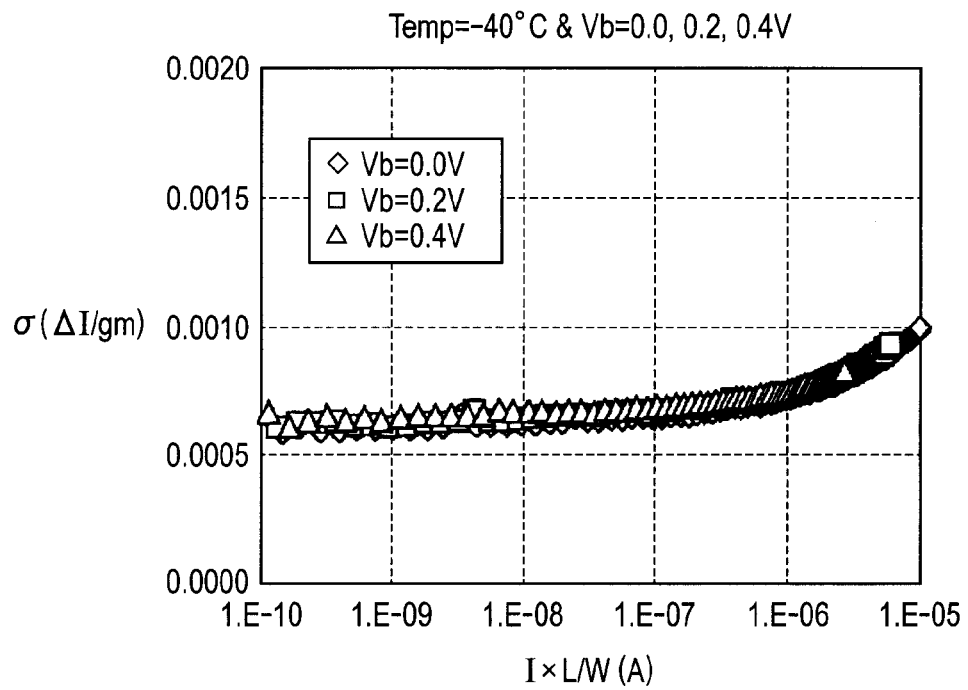

FIG. 4A is a diagram showing a change of $\sigma(\Delta I/gm)$ with respect to I×L/W when the temperature is 25° C. and the back gate voltage Vb is 0.0 V, 0.2 V, and 0.4 V for transistors having no hump characteristic. Here, I is the current flowing in the transistor, L is the gate length, and W is the channel width.

Figure 4B:
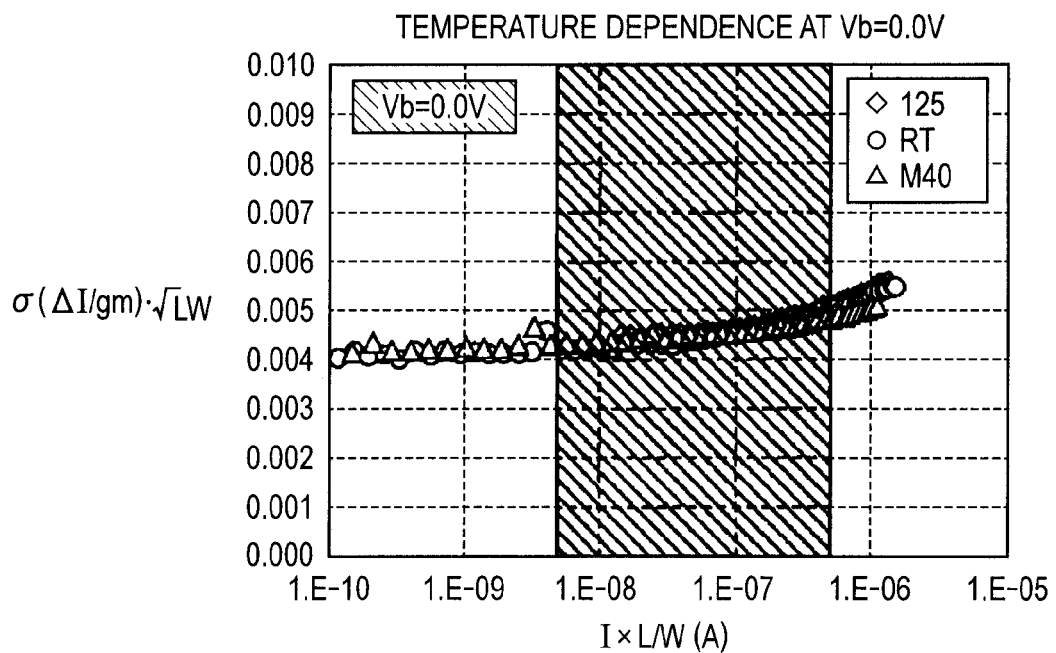

FIG. 4B is a diagram showing a change of $\sigma(\Delta I/gm)$ with respect to I×L/W when the temperature is −40° C. and the back gate voltages Vb are 0.0 V, 0.2 V, and 0.4 V for the transistors having no hump characteristic. Incidentally, FIG. 4A and FIG. 4B are measurement examples with the PMOS transistors, and the back gate voltages take positive values. Although conductivity types of the MOS transistors differ between FIG. 3 and FIG. 4, it was checked that the change of $\sigma(\Delta I/gm)$ was not caused by the conductivity type, but was caused by existence/absence of the hump characteristic.

(1)' As shown in FIG. 4A and FIG. 4B, the σ(ΔI/gm) characteristic shows a tendency that with decreasing current flowing in the transistor, the σ(ΔI/gm) decreases monotonously. That is, the σ(ΔI/gm) characteristic decreases much at the time of making it operate in the weak inversion region than in the strong inversion region.

(2)' As shown in FIG. 4A and FIG. 4B, the σ(ΔI/gm) characteristic is not dependent on the back gate voltage.

(3)' As shown in FIG. 4A and FIG. 4B, the σ(ΔI/gm) characteristic is not dependent on the temperature. Therefore, in the σ(ΔI/gm) characteristic, "the increase tendency in the weak inversion region" generally known until now originates in the hump characteristic of the transistor in the weak inversion region. It can be inferred that a fact that the σ(ΔI/gm) increased in the weak inversion region in the literature [1] arises from the use of the transistors having the hump characteristic.

Therefore, even if a pair of the differential pair transistors designed with channel sizes L and W with which a desired mismatch characteristic (σ(ΔI/gm)) is obtainable in the strong inversion region of operation is used in the weak inversion region of operation or the moderate inversion region of operation, it is possible to suppress the variation in the input offset lower than the variation in the input offset in the strong inversion region of operation.

Incidentally, although the experimental result is for the case where the differential pair is formed with the NMOS transistors, the same result will be obtained even if the differential pair is formed with the PMOS transistors.

Here, how to define the strong inversion region, the weak inversion region, and the moderate inversion region that are operation regions of the transistor defined by the literature [5] will be explained. This definition shall be followed also in these embodiments.

As shown by FIG. 3.26 of the literature [5], each inversion region is defined based on a gm/I characteristic of the transistor.

The gm/I characteristic is a constant in the weak inversion region, and is dependent on IC-γ in the strong inversion region. With IC=I/I0, $I0 = 2n \times \mu_0 \times C_{ox} \times \{(K_B \times T)/q\}^2 \times (W/L)$ holds. Here, n denotes a constant of 1.2 to 1.4, $\mu_0$ denotes mobility at a moderate inversion central value, $C_{ox}$ denotes a capacity of the gate oxide film, $K_B$ denotes Boltzmann constant, T denotes an absolute temperature, q denotes a unit charge, W denotes the channel width, and L denotes the gate length.

A value of IC at which an asymptote of the characteristic in the weak inversion region and an asymptote of the characteristic in the strong inversion region intersect is defined as a center of the moderate inversion region. A range of the moderate inversion is a region within ±1 digit from this center. A region of a less current than that of the moderate inversion region is defined as the weak inversion region, and a region of a more current than that of the moderate inversion region is defined as the strong inversion region.

First Embodiment

An embodiment of the present invention is based on the above-mentioned finding that has newly been found by the inventors of this application.

Figure 5:
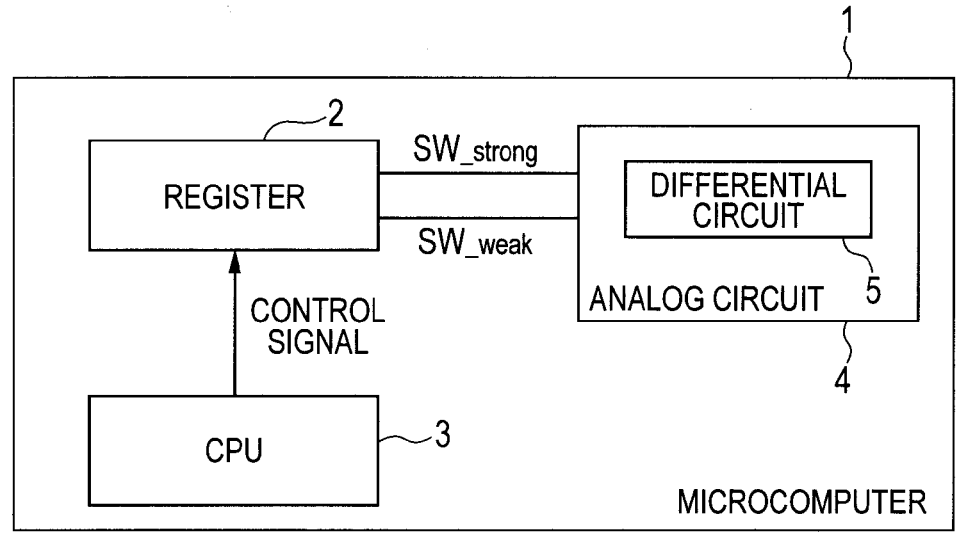
FIG. 5 is a diagram showing a configuration of a semiconductor device of the embodiment of the present invention.

FIG. 5 is a diagram showing a configuration of a microcomputer that is a semiconductor device of the embodiment of the present invention. This microcomputer 1 is equipped at least with a CPU 3, a register 2, and an analog circuit 4.

The analog circuit 5 includes amplifier section circuits, such as a power source circuit, a comparison circuit (comparator), and an ADC circuit. These circuits include a differential circuit 5.

The CPU 3 sets levels of a control signal SW_strong and a control signal SW_weak. The register 2 outputs the control signal SW_strong and the control signal SW_weak according to a setting of the CPU 3.

Figure 6:
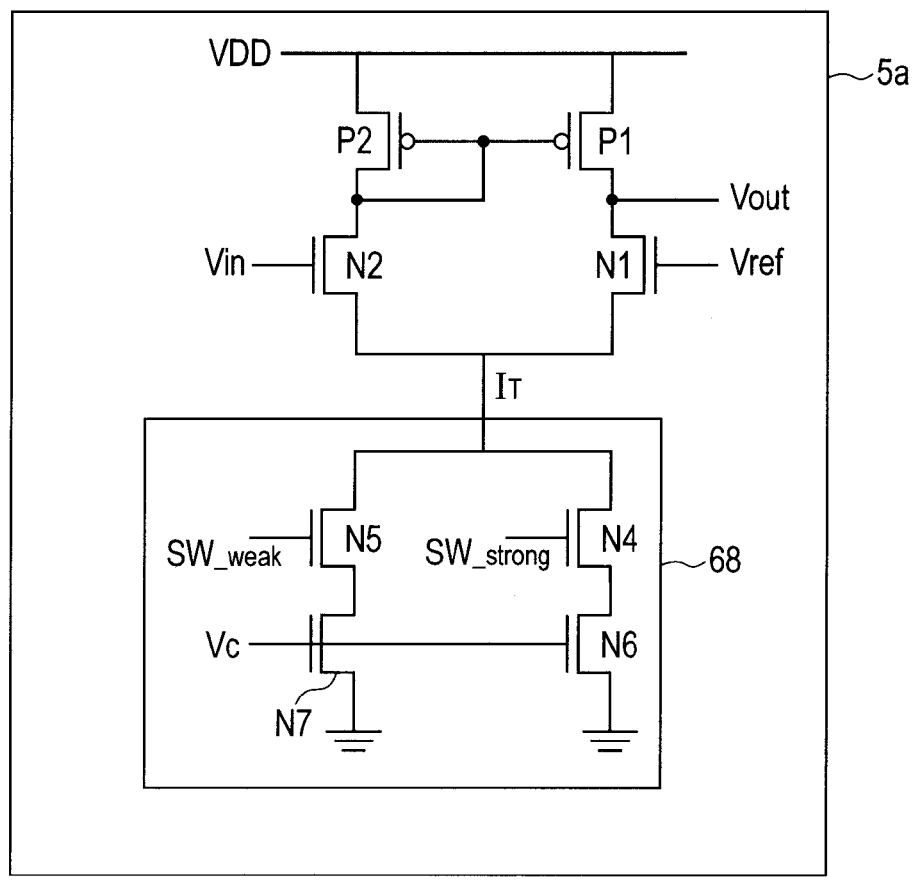
FIG. 6 is a diagram showing a configuration of a differential circuit of a first embodiment.

The differential circuit 5 receives the control signal SW_strong and the control signal SW_weak. FIG. 6 is a diagram showing a configuration of the differential circuit of the first embodiment.

With reference to FIG. 6, the differential circuit 5a includes a pair of PMOS transistors P1 and P2 that are load transistors, the NMOS transistors N1 and N2 that constitute the differential pair coupled to a pair of load transistors, and a tail current source 68 coupled to the NMOS transistors N1 and N2. The PMOS transistors P1 and P2 constitute a current mirror.

For the NMOS transistors N1 and N2 that constitute the differential pair, the transistors having no hump characteristic, that is, ones such that a value of σ(ΔI/gm) decreases monotonously with a decrease of currents flowing in the NMOS transistors N1 and N2 are used. However, σ denotes the standard deviation, ΔI denotes a difference of the amounts of current of the NMOS transistors N1 and N2, and gm denotes transconductance of the NMOS transistors N1 and N2. Such transistors having no hump characteristic can be obtained by, for example, manufacturing it appropriately so as not to have a divot at the edge of the STI region.

σ(ΔI/gm) is equal to the input offset voltage of the NMOS transistors N1 and N2 that are the differential pair. Dimensions of the channels of the NMOS transistors N1 and N2 are designed so that they may have the desired mismatch characteristic, that is, σ(ΔI/gm) may become equal to or less than the input offset voltage in the strong inversion region.

Moreover, in this design consideration, for the PMOS transistors P1 and P2 that are load transistors, the transistors having no hump characteristic, i.e., transistors having a characteristic that, with a decrease of currents flowing in the PMOS transistors P1 and P2, a value of σ(ΔI/gm) decreases monotonously may be used similarly. However, σ denotes the standard deviation, ΔI2 denotes the difference of the amounts of current of the PMOS transistors P1 and P2, and gm2 denotes the transconductance of the PMOS transistors P1 and P2.

By changing a magnitude of a tail current by the tail current source 68, the currents flowing in the differential pair transistors N1 and N2 are changed to at least two levels. By the tail current source 68 supplying a first tail current, it is possible to make the differential pair transistors N1 and N2 operate in the strong inversion region, and by the tail current source 68 supplying a second tail current, it is possible to make the differential pair transistors N1 and N2 operate in the moderate inversion region or the weak inversion region. Since when the NMOS transistors N1 and N2 operate in the weak inversion region, there is no hump characteristic in them, the amount of the input offset becomes smaller than that in the strong inversion region.

A tail current source 68 includes the NMOS transistors N4 and N6 that are provided in a first path between one end of the differential pair transistors N1 and N2 and the NMOS transistors N5 and N7 that are provided in a second path between one end of the differential pair transistors N1 and N2 and the ground.

The common potential Vc is supplied to the gates of the NMOS transistors N6 and N7. The channel width of the NMOS transistor N7 is W0 and the channel width of the NMOS transistor N6 is 99×W0. Let it be assumed that the gate length is the same.

The control signal SW_weak is inputted into a gate of the NMOS transistor N5. The control signal SW_strong is inputted into a gate of the NMOS transistor N4.

At the time of operation in the weak inversion region or the moderate inversion region, the CPU 3 sets the control signal SW_weak to a high level, and sets the control signal SW_strong to a low level. Thereby, the NMOS transistor N5 turns ON. As a result, a current flows in the NMOS transistor N7 of a channel width W0.

At the time of operation in the strong inversion region, the CPU 3 sets the control signal SW_weak to the high level, and sets the control signal SW_strong to the high level. Thereby, the NMOS transistors N4 and N5 turn ON. As a result, currents flow in the NMOS transistor N7 of the channel width W0 and the NMOS transistor N6 of the channel width 99×W0.

This enables the first tail current IT flowing at the time of operation in the strong inversion region to be increased 100 times as much as the second tail current IT flowing at the time of operation in the weak inversion region or the moderate inversion region. Incidentally, multiplication by 100 is a mere example and a ratio of the tail currents can be set to an arbitrary value by changing a ratio of the channel widths of the NMOS transistor N7 and the NMOS transistor N6.

According to the embodiments of the present invention, one differential pair can support the strong inversion region of operation and the weak inversion region of operation commonly, and therefore it becomes possible to reduce its area to small dimensions.

Moreover, there was a problem that with lower consumption current, much time was taken to charge and discharge the junction, which makes slower the operation. In this case, if the gate length is shortened while maintaining a current value to be flown in the differential pair, a response of the transistors constituting the differential pair will be made faster and the operation will be speeded up. However, since the channel areas of the transistors constituting the differential pair became smaller, there was a problem that it was difficult to control the variation in the output offset caused by the mismatch. However, according to the embodiment of the present invention, even if the gate length of the transistors constituting the differential pair is shortened, it is possible to control to make smaller the variation in the input offset at the time of operation at low speed with a low consumption current than the variation in the input offset at the time of operation at high speed with a high consumption current. Therefore, the present invention can solve the problem that when the variation in the input offset is controlled, the speed at the time of low consumption current becomes too slow.

First Modification

Figure 7:
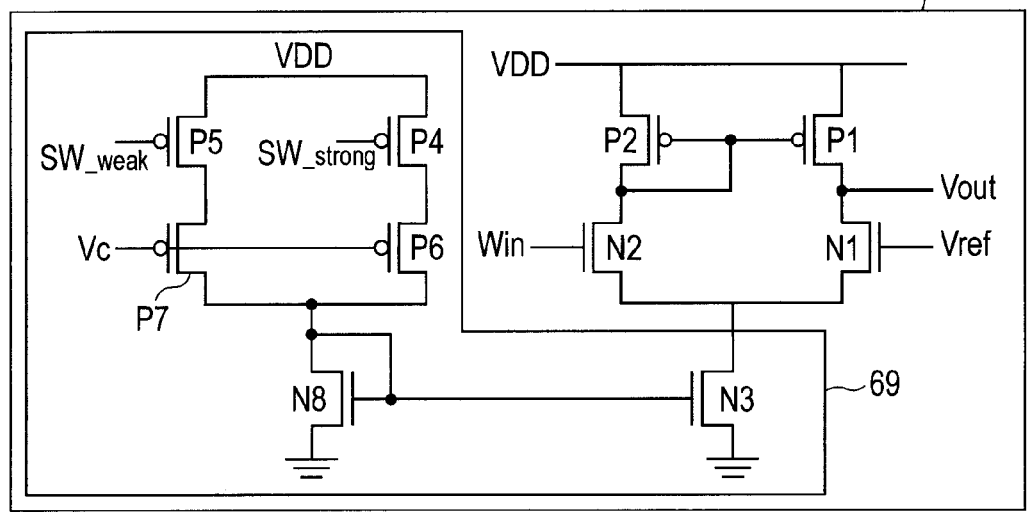
FIG. 7 is a diagram showing a configuration of a differential circuit of a first modification of the first embodiment.

FIG. 7 is a diagram showing a configuration of a differential circuit of a first modification of the first embodiment.

With reference to FIG. 7, in this differential circuit 5b, the tail current source 69 is different from the tail current source 68 of FIG. 6.

The tail current source 69 includes an NMOS transistor N3 provided between one end of the differential pair transistors N1 and N2 and the ground, and an NMOS transistor N8 that constitutes the current mirror together with the NMOS transistor N3.

The tail current source 69 is further equipped with PMOS transistors P4 and P6 that are provided in the first path between the power source node Vdd and one end of the NMOS transistor N8, and the PMOS transistors P5 and P7 that are provided in the second path between the power source node Vdd and one end of the NMOS transistor N8.

The common potential Vc is supplied to the gates of the PMOS transistors P6 and P7. The channel width of the PMOS transistor P7 is W0 and the channel width of the PMOS transistor P6 is 99×W0. Let it be assumed that the gate length is the same.

The control signal SW_weak is inputted into the gate of the PMOS transistor P5. The control signal SW_strong is inputted into the gate of the PMOS transistor P4.

At the time of operation in the weak inversion region or the moderate inversion region, the CPU 3 sets the control signal SW_weak to the low level, and sets the control signal SW_strong to the high level. Thereby, the PMOS transistor P5 turns ON. As a result, a current flows in the PMOS transistor P7 of the channel width W0.

At the time of operation in the strong inversion region, the CPU 3 sets the control signal SW_weak to the low level, and sets the control signal SW_strong to the low level. Thereby, the PMOS transistors P4 and P5 turn ON. As a result, currents flow in the PMOS transistor P7 of the channel width W0 and the PMOS transistor P6 of the channel width 99×W0.

By this, at the time of operation in the strong inversion region, a tail current IT can be changed to 100 times that at the time of operation in the weak inversion region or the moderate inversion region Second Modification Although in the first embodiment and the first modification, the channel width of the NMOS transistor N7 was set to W0, the channel width of the PMOS transistor P7 was set to W0, the channel width of the NMOS transistor N6 was set to 99×W0, and the channel width of the PMOS transistor P6 was set to 99×W0, the channel widths are not limited by these specifications.

For example, it may be all right that the gate lengths of the NMOS transistor N7 and the PMOS transistor P7 are set to L0, and the gate lengths of the NMOS transistor N6 and the PMOS transistor P6 are set to L0/99.

Second Embodiment

In a second embodiment, a concrete example of the transistors having no hump characteristic that was explained in the first embodiment will be explained.

It does not hold true that whichever transistor satisfies a nature that "with a decrease of current values flowing in the transistors, σ(ΔI/gm) decreases monotonously" that was limited in the first embodiment. In a usual layout, in the case of a transistor that does not satisfies this condition (for example, a transistor having a divot in the edge of the STI region), its hump characteristic can be suppressed by modifying the gate in such a way as will be described below.

Figure 8:
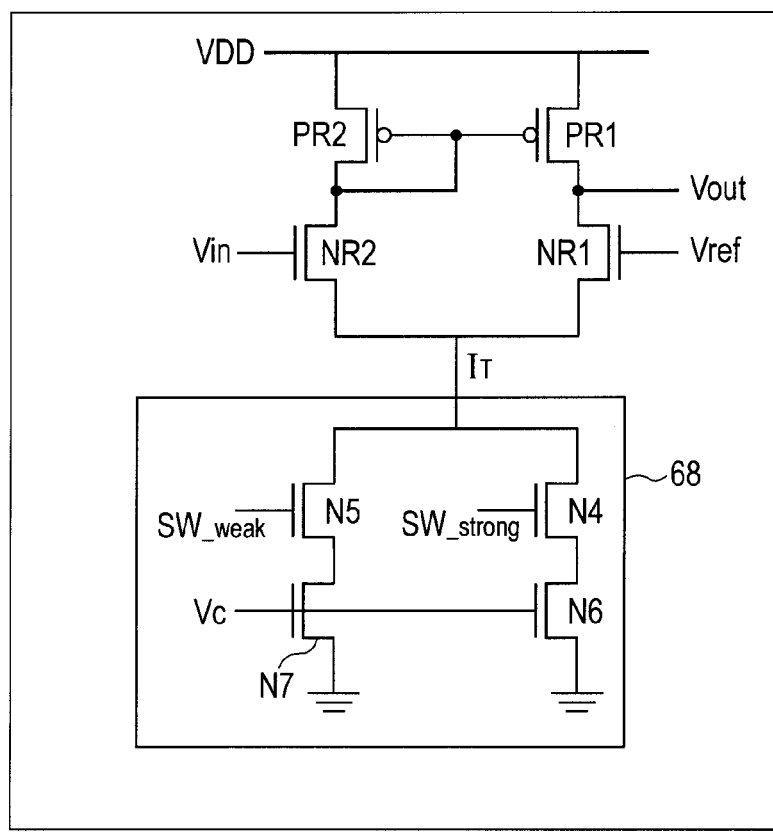
FIG. 8 is a diagram showing a configuration of a differential circuit of a second embodiment.

FIG. 8 is a diagram showing a configuration of a differential circuit of the second embodiment. With reference to FIG. 8, this differential circuit 5C is different from the differential circuit shown in FIG. 5 in a point that for PMOS transistors PR1 and PR2 and NMOS transistors NR1 and NR2, ones that use a layout structure explained below are used.

FIGS. 9A, 9B, 9C, and 9D are diagrams for explaining the layout structure of the NMOS transistors NR1 and NR2.

Figure 9A:
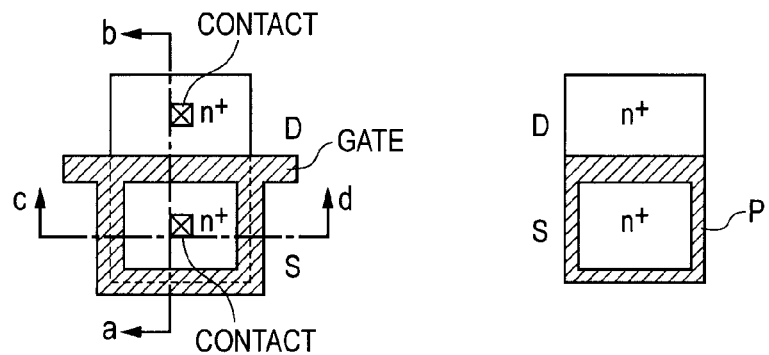
Figure 9B:
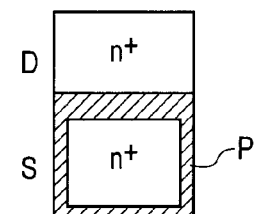

FIG. 9A is a plan view of the NMOS transistors NR1 and NR2. FIG. 9B is a diagram showing FIG. 9A from which the gate is removed.

Figure 9C:
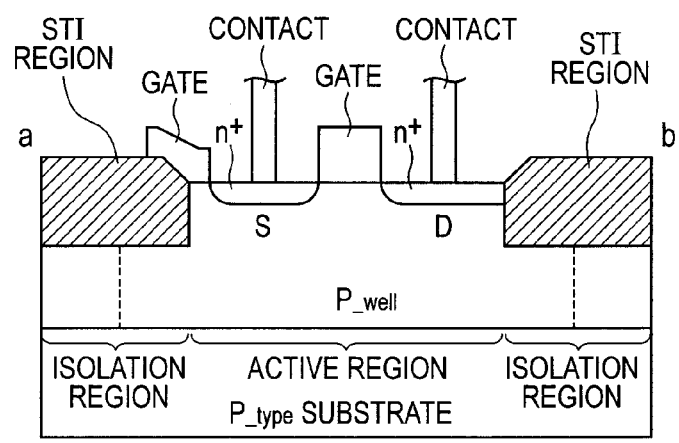
Figure 9D:
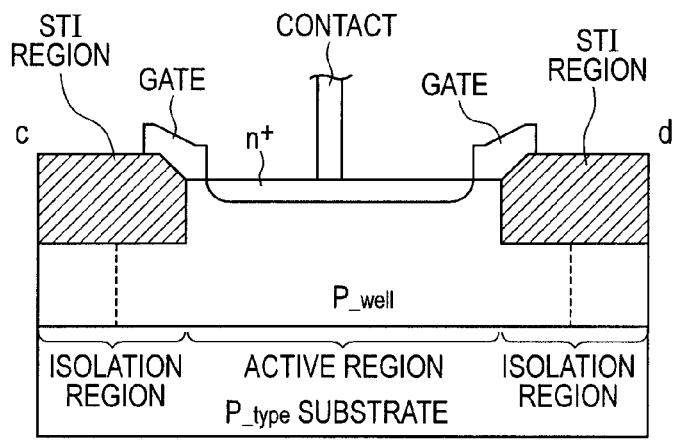

FIG. 9C is an a-b sectional view in FIG. 9A. FIG. 9D is a c-d sectional view in FIG. 9A.

The gate of the NMOS transistors NR1 and NR2 is formed in the shape of a ring covering an adjoining region between the STI (Shallow Trench Isolation) region and the active region (n+ type region) on the source side.

Also in the case where both the PMOS transistors PR1 and PR2 are specified to be transistors having no hump characteristic, what is necessary is only to form a p+ active region instead of the n+ active region in FIG. 9A to FIG. 9D and to form an N_well instead of a P_well, leaving other configurations to be the same as FIG. 9A to FIG. 9D. That is, the gate of the PMOS transistors PR1 and PR2 is formed in the shape of a ring so as to cover the adjoining region between the STI (Shallow Trench Isolation) region and the active region (p+ type region) on the source side.

Figure 10:
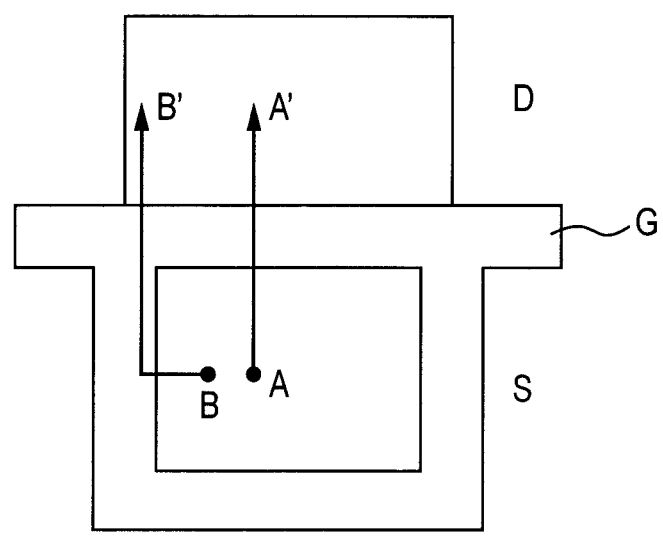
FIG. 10 is a layout plan view of the NMOS transistors NR1 and NR2.
Figure 11A:
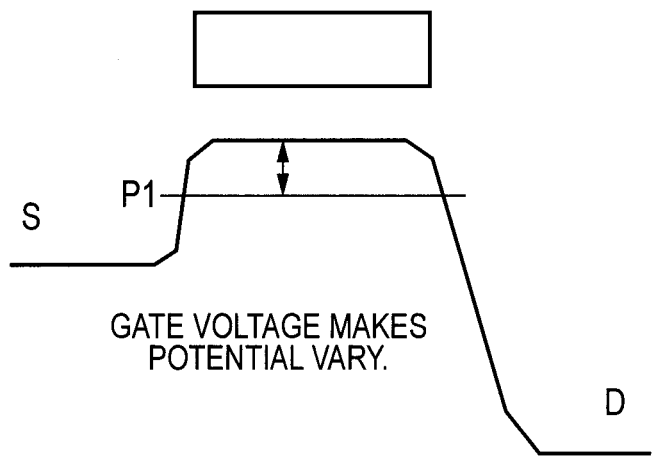

FIG. 11A is a diagram showing a potential on a path that is shown by A-A' in a layout plan view of FIG. 10 and extends from the source S to the drain D.

As shown in FIG. 11A, the gate potential makes the potential height vary and the electric charges are excited in a channel from the source S and flows in A-A'.

Figure 11B:
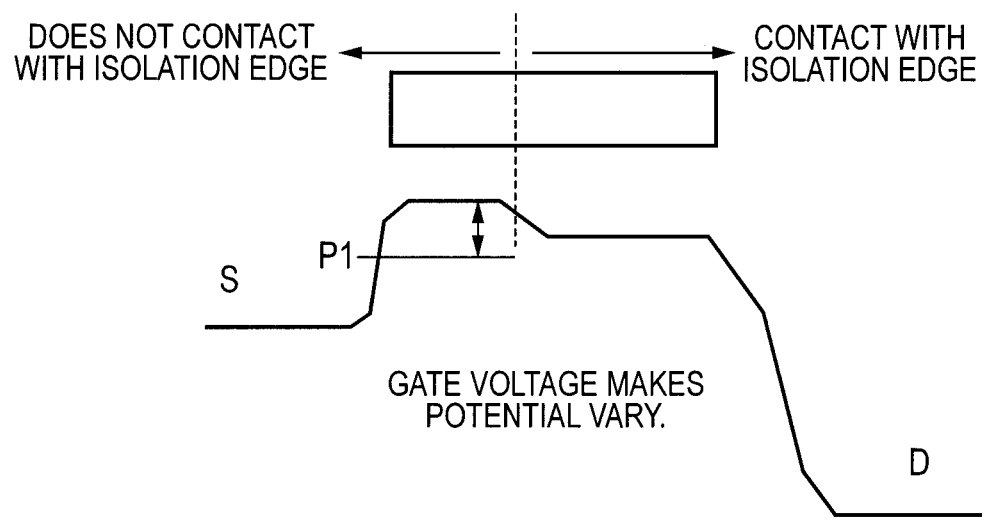

FIG. 11B is a diagram showing a potential on a path that is shown by B-B' in the layout plan view of FIG. 10 and extends from the source to the drain.

With reference to FIG. 11B, the electric charges excited directly under the gate on the left side of the sheet are considered.

Desired n+ or p+ injection into the source/drain is not done in the source part covered with the gate on the left side of the sheet because the source part is covered with the gate. Therefore, a portion in which the source part is covered with the gate has the same impurity structure as an original channel (directly under a path A-A').

The gate voltage Vg varies its potential height and the electric charges are excited at the channel directly under the gate at a point B. The potential barrier at this time is the same as that in the path A-A'.

On the other hand, in a path B-B', the electric charges excited directly under the gate move to a gate lower part that adjoins the STI region. If the hump characteristic exists in this portion, the potential barrier will be low. The electric charges move in an upward direction of the sheet in the gate lower part that adjoins the STI region, and reach B'.

A characteristic point in the path B-B' described above is that a potential height of excitation of the electric charges to just under the gate on a left side of the sheet on the path B-B' is equal to the excitation potential height of the electric charges on the path A-A' (P1 for the both). That is, on either path, the gate voltage Vg that flows from the source into the drain becomes the same value. Therefore, it is possible to prevent a phenomenon that, with an increase of the gate voltage Vg, electric charges are excited in the channel, specifically, in the channel edge earlier than in the channel central part. Therefore, a characteristic of the current flowing in the transistor becomes one shown in FIG. 2C that does not have the hump characteristic.

Therefore, even in the case of a transistor in which a isolation adjacent part that may cause the hump characteristic exists with a normal gate configuration, if the gate configuration is formed as in the second embodiment, appearance of the hump characteristic can be suppressed. That is, the tendency "with a decrease of the current value flowing in the transistor, $\sigma(\Delta I/gm)$ decreases monotonously" can be maintained.

The embodiments disclosed this time are exemplifications at all points, and it should be considered that they are not restrictive. It is intended that a scope of the present invention is not shown by the explanation described above but by what is claimed is, and the present invention includes what is claimed is, a meaning of evenness, and all modifications within the scope.

What is claimed is:

1. A semiconductor device comprising:
differential pair transistors; and
a tail current source configured to supply switchable tail current so that an amount of current flowing in the differential pair transistors takes at least first current value and second current value smaller than the first current value,
wherein the differential pair transistors have each a characteristic that, with a decrease of the current flowing in the differential pair transistor, a value of $\sigma(\Delta I/gm)$ decreases monotonously,
where $\sigma$ denotes a standard deviation, $\Delta I$ denotes a difference of the amounts of current of the differential pair transistors, and gm denotes transconductance of the differential pair transistors, and
wherein the differential pair transistors are configured to operate in a strong inverse region with the tail current having the first current value, and are configured to operate in a moderate inversion region or a weak inversion region with the tail current having the second current value.

2. The semiconductor device according to claim 1,
wherein the tail current source includes a first transistor and a second transistor that are provided serially in a first path between the differential pair transistors and a ground, and
a third transistor and a fourth transistor that are provided serially in a second path between the differential pair transistors and the ground,
wherein the first and third transistors have gates coupled to each other to be supplied with a common voltage,
wherein the second and fourth transistors both turns ON to make the differential pair transistors operate, and
wherein the second transistor turns ON and the fourth transistor turns OFF to make the differential s air transistors operate in the moderate inversion region or the weak inversion region.

3. The semiconductor device according to claim 1,
wherein the tail current source includes first transistor coupled to the differential pair transistors,
a second transistor that constitutes a current mirror together with the first transistor,
a third transistor and a fourth transistor that are provided serially in a first path between a power source node and the second transistor, and
a fifth transistor and a sixth transistor that are provided serially in a second path between the power source node and the second transistor,
wherein the third and fifth transistors have gates coupled to each other to be supplied with a common voltage,
wherein the fourth and sixth transistors both turns ON to make the differential pair transistors operate, and
wherein the fourth transistor turns ON and sixth transistor turns OFF to make the differential pair transistors operate in the moderate inversion region or the weak inversion region.

4. The semiconductor device according to claim 1, further comprising:
a pair of load transistors,
wherein the pair of load transistors has a characteristic that, with a decrease of currents flowing in the pair of load transistors, a value of $\sigma(\Delta I2/gm2)$ decreases monotonously,
where $\sigma$ denotes a standard deviation, $\Delta I2$ denotes a difference of the amounts of current of the pair of load transistors, and gm2 denotes transconductance of the pair of load transistors.

5. A semiconductor device, comprising:
- differential pair transistors, each having a gate formed in a shape of a ring covering an adjoining region between an isolation region and an active region on a source side; and
- a tail current source configured to supply switchable tail currents so that an amount of current flowing in the differential pair transistors takes at least first current value and a second current value smaller than the first current value,
- wherein the differential pair transistors are configured to operate in a strong inverse region with the tail current having the first current value, and are configured to operate in a moderate inversion region or a weak inversion region with the tail current having the second current value.

6. The semiconductor device according to claim 5,
- wherein the tail current source includes a first transistor and a second transistor that are provided serially in a first path between the differential pair transistors and the ground, and
- a third transistor and a fourth transistor that are provided serially in a second path between the differential pair transistors and the ground,
- wherein the first and third transistors have gates coupled to each other to be supplied with a common voltage,
- wherein the second and fourth transistors both turn ON to make the differential pair transistors operate in the strong inversion region, and
- wherein the second transistor turns ON and the fourth transistor turns OFF to make the differential pair transistors operate in the moderate inversion region or the weak inversion region.

7. The semiconductor device according to claim 5,
- wherein the tail current source includes a first transistor coupled to the differential pair transistors,
- a second transistor that constitutes a current mirror together with the first transistor,
- a third transistor and a fourth transistor that are provided serially in a first path between a power source node and the second transistor,
- a fifth transistor and a sixth transistor that are provided serially in a second path between the power source node and the second transistor,
- wherein the third and fifth transistors have gates coupled to each other to be supplied with a common voltage and channel widths set so as to conform to magnitudes of the first tail current and the second tail current,
- wherein the fourth and sixth transistors both turn ON to make the differential pair transistors operate, and
- wherein the fourth transistor turns ON and the sixth transistor turns OFF to make the differential pair transistor in the moderate inversion region or the weak inversion region.

8. The semiconductor device according to claim 5, further comprising:
- a register storing information for setting the amount of current of the tail current source; and
- a CPU setting the information to the register.

9. The semiconductor device according to claim 6, further comprising:
- a register storing information for controlling ON and OFF of the fourth transistor; and
- a CPU setting the information to the register.

10. The semiconductor device according to claim 6,
- wherein the first and third transistors have channel widths set so as to conform to the first tail current value and the second tail current value.

11. The semiconductor device according to claim 7, further comprising:
- a register storing information for controlling ON and OFF of the sixth transistor; and
- a CPU setting the information to the register.

12. The semiconductor device according to claim 6,
- wherein the third and fifth transistors have channel widths set so as to conform to the first tail current value and the second tail current value.

13. The semiconductor device according to claim 1, further comprising:
- a register storing information for setting the amount of current of the tail current source; and
- a CPU setting the information to the register.

14. The semiconductor device according to claim 2, further comprising:
- a register storing information for controlling ON and OFF of the fourth transistor; and
- a CPU setting the information to the register.

15. The semiconductor device according to claim 2,
- wherein the first and third transistors have channel widths set so as to conform to the first tail current value and the second tail current value.

16. The semiconductor device according to claim 3, further comprising:
- a register storing information for controlling ON and OFF of the sixth transistor; and
- a CPU setting the information to the register.

17. The semiconductor device according to claim 3,
- wherein the first and third transistors have channel widths set so as to conform to the first tail current value and the second tail current value.

* * * * *